United States Patent

[11] 3,573,803

[72] Inventors Andre Edouard Joseph Chatelon Montrouge; Didier Charles Strube, Garches, France
[21] Appl. No. 793,781
[22] Filed Jan. 24, 1969
[45] Patented Apr. 6, 1971
[73] Assignee International Standard Electric Corporation New York, N.Y.
[32] Priority Feb. 20, 1968
[33] France
[31] 140477

[54] TIME DIVISION MULTIPLEX DIGITAL-TO-ANALOG CONVERTER
10 Claims, 14 Drawing Figs.

[52] U.S. Cl. .......... 340/347
[51] Int. Cl. .......... H03k 13/02
[50] Field of Search .......... 340/347; 325/38

[56] References Cited
UNITED STATES PATENTS

| | | | |
|---|---|---|---|
| 3,427,444 | 2/1969 | Tang | 340/347 |
| 3,426,296 | 2/1969 | Christiansen | 325/38 |
| 3,414,818 | 12/1968 | Reidel | 340/347 |

*Primary Examiner*—Maynard R. Wilbur
*Assistant Examiner*—Jeremiah Glassman
*Attorneys*—C. Cornell Remsen, Jr., Walter J. Baum, Percy P. Lantzy, Philip M. Bolton, Isidore Togut and Charles L. Johnson, Jr.

ABSTRACT: A plurality of binary counters are provided, each of which are assigned to a different channel code, and arranged in two groups. A master binary counter advancing in synchronism with the timing of the input codes and logic circuitry associated with each counter cooperate to cause the counters of one group to convert the code signals of that group and simultaneously connect the counters of the other group in series and to function as shift registers to store serial input codes. The functions of the group of counters are then reversed. The counters of a group in which codes have been previously stored cooperate with the master binary counter and a bistable device coupled to each counter to produce PWM pulses which are filtered to reproduce the analog signals represented by the stored codes.

Inventors
ANDRÉ E. J. CHATELON
DIDIER C. STRUBE
By Alfred C. Hill
Agent

Inventors
ANDRÉ E. J. CHATELON
DIDIER C. STRUBE
By Alfred C. Hill
Agent

Inventors
ANDRÉ E. J. CHATELON
DIDIER C. STRUBE
By Alfred C. Hill
Agent

TIME DIVISION MULTIPLEX DIGITAL-TO-ANALOG CONVERTER

BACKGROUND OF THE INVENTION

The present invention relates to pulse code modulation (PCM) systems and more particularly to a time division multiplex analog-to-digital converter or decoder which delivers pulse-width modulated data representative of the codes received.

In the copending application of C. P. H. LeRouge et al. (case 11-3-6), Ser. No. 786,918, filed Dec. 26, 1968, a time division multiplex coding circuit has been described, wherein the $m$ channels are distributed into two groups of $m/2$ channel coders and the analog input signals of the two groups are coded alternately by comparing them to a ramp signal. This coder is characterized by the fact that is does not comprise any sampling nor holding circuit, that the channel coding time is $m/2$ times smaller than that of a conventional sawtooth comparison coder and that the coding duration is constant and independent of the number of channels.

In the same copending application, there is also described a decoder adapted for operation with the coder described, wherein the received code signals are distributed into two groups of circuits, each one comprising $m/2$ channel decoding circuits. However, the coding and decoding circuits are not of universal use, since coding and decoding is carried out on the basis of a cyclic binary code, whereas it is often required that coding and decoding should be carried out on the basis of a natural binary code.

A sawtooth comparison time division multiplex coder has previously been described wherein the channels are also distributed to two groups of channel coders which deliver natural binary codes.

SUMMARY OF THE INVENTION

An object of the present invention is to provide a time division multiplex digital-to-analog converter or decoder operable with the latter mentioned coder delivery natural binary codes.

In accordance with the present invention, the decoder comprises a decoding circuit per channel, these circuits being arranged in two groups with each group decoding $m/2$ channels. In each group the decoding is carried out in two successive "operation cycles" of duration equal to half of the sampling period. These cycles are the "reception cycle" reserved to the parallel storage in the channel decoding circuits of the codes received in series form, and the "decoding cycle" during which the codes stored in said circuits are compared to those delivered by a master decoding counter which advances in a regular manner in order to show, during the cycle, $2^n$ different states if the codes comprise $n$ digits. When the code delivered by this counter is identical to that stored in a given decoding circuit, an associated flip-flop is set in the 1 state. Since this flip-flop was reset at the beginning of the decoding cycle, it delivers a pulse width modulated signal which may be demodulated by means of a low pass filter in order to obtain the analog signal corresponding to the code stored in the decoding circuit.

The codes received are processed alternately in the two groups, i.e., while one group is in a reception cycle the other group is simultaneously in a decoding cycle.

It will be noted that this circuit is particularly adapted to a modular construction since the number of channels may be varied by modifying only the number of channel decoding circuits.

Another object of the present invention is to provide a high-speed decoder for time multiplex PCM signals wherein the number of channels is not limited.

A feature of this invention is the provision of a digital-to-analog converter comprising input means for $m$ digital codes in serial form, each of the codes having $n$ digits, where both $m$ and $n$ are integers greater than one; master binary counting means having a plurality of output signals coupled to the input means operating in synchronism with the timing of the digits of the codes; a first group of $m/2$ binary counting means coupled to the input means and the master counting means responsive to selected ones of the output signals to connect each of the counting means of the first group as independent counting means for a first given time interval and to connect each of the counting means of the first group as a shift register and in series with each other for a second given time interval different than the first time interval, the counting means of the first group being loaded with $m/2$ of the codes during the second time interval; a second group of $m/2$ binary counting means coupled to the input means and the master counting means coupled to the input means and the master counting means responsive to the selected ones of the output signals to connect each of the counting means of the second group as independent counting means for the second time interval and to connect each of the counting means of the second group as a shift register and in series with each other for the first time interval, the counting means of the second group being loaded with the remaining $m/2$ of the codes during the first time interval; first $m/2$ logic circuit means, each of the first logic circuit means being coupled to a different one of the counting means of the first group and in common to the master counting means responding to the selected ones of the output signals, others of the output signals, and the code stored in the associated one of the counting means of the first group during the first time interval to produce a pulse width modulated signal having a width representative of the code stored in the associated one of the counting means of the first group; and second $m/2$ logic circuit means, each of the second logic circuit means being coupled to a different one of the counting means of the second group and in common to the master counting means responding to the selected ones of the output signals, others of the output signals and the code stored in the associated one of the counting means of the second group during the second time interval to produce a pulse width modulated signal having a width representative of the code stored in the associated one of the counting means of the second group.

In a time division multiplex PCM transmission system designed for transmitting $2p$ digits per sampling cycle of duration $Ts$ which are distributed into $m \cdot n$ message digits ($m$ channels, $n$ digits per code) and $2y$ signalling and/or synchronization digits, the invention is characterized by the fact that a channel decoding circuit or channel circuit is assigned to each of the $m$ channels, that the channel circuit delivers a pulse width modulated signal which, after demodulation by a low pass filter, is converted into an analog signal representing the value of the code received, that the channel circuits are distributed into two groups GD1, GD2 of $m/2$ circuits each that the processing of the received data is carried out in two successive operation cycles of duration $Ts/2$, namely, the code reception cycle $Tcr$ and the decoding cycle $Tcd$ and that the received codes are directed into the channel circuits of the group GD1 (GD2) while the codes received previously are decoded in the channel circuits of the group GD2 (GD1).

Another characteristic of the invention lies in the fact that, if $tr$ designates the duration of a digit time slot at the reception, $$Tcr = \frac{m.n + 2y}{2} tr$$

that the decoding is carried out during a decoding cycle by comparing the codes stored in the channel circuits to the codes delivered during this cycle by a master decoding counter comprising ($n$+1) flip-flops of rank 0,1,2...$j$...$n$, the most significant flip-flop being that of rank zero, the period $td$ of the advance signals applied to this master counter being equal to $Tcd/2^n$ in the case of a linear decoder; that the ratio between the durations $tr$ and $td$ is equal to $$\frac{2^{n+1}}{m \cdot n + 2y}$$

that, if this ratio is different form one, the signals of period $td$, delivered by a generator with adjustable frequency, are synchronized by means of a phase-lock loop; that the highest rank flip flop of the master counter delivers the operation cycle signals C01 (on its output 0) and C02 (on its output 1), the signal C01 (C02) defining the reception cycle in the circuit GD1 (GD2) and the signal C02 (C01) defining the decoding cycle in the circuit GD2 (GD1); and that there is generated, during each of these reception cycles, clock signals *Hr* 1 (for the circuit GD1) or *Hr* 2 (for the circuit GD2) of period *tr* and which appear only at the times where signalling and/or synchronization signals are not received.

Another characteristic of the invention lies in the fact that, for a nonlinear decoder in which the range of voltages to be decoded is divided into $2^a$ unit quantizing steps of duration *t'd*, the ratio between the durations *tr* and *t'd* is chosen equal to $$\frac{2^{a+1}}{m \cdot n+2y}.$$

Another characteristic of the invention lies in the fact that each channel circuit comprises first *n* flip-flops of the JK type connected as a shift register and receiving the advance signals *Hr* 1 (*Hr* 2), second *n* electronic gates **1,2,...*j*...*n*** associated with the *n* flip-flops, the gate *j* being activated during a decoding cycle when, simultaneously, the flip-flop of rank *j* of the master counter sets to the 1 state and all the flip-flops of lower rank of the register (flip-flops of rank 1 to *j*–1) are in the 0 state, the signal delivered by said gate being applied to the flip-flop of rank *j* in order to control its setting to the 0 state and third a decoding flip-flop set to the 1 state at the end of the reception cycle and to the 0 state when all the flip-flops of the register are in the 0 state; that, during a reception cycle, the registers of the m/2 channel circuits of the group are connected in series in order to store the codes received during this time; and that, during a decoding cycle, the registers are isolated and that the codes delivered by the master counter are compared, by means of the gates associated to each register, to the code written in said register up to the time where all the flip-flops of this register are in the 0 state, said condition controlling the resetting into the 0 state of the decoding flip-flop, the duration of the signal which is present on the output 1 of the said flip-flop representing the value of the code stored in the register.

BRIEF DESCRIPTION OF THE DRAWING

The above-mentioned and other features and objects of this invention will become apparent by reference to the following description taken in conjunction with the accompanying drawings, in which.

Figure 1:
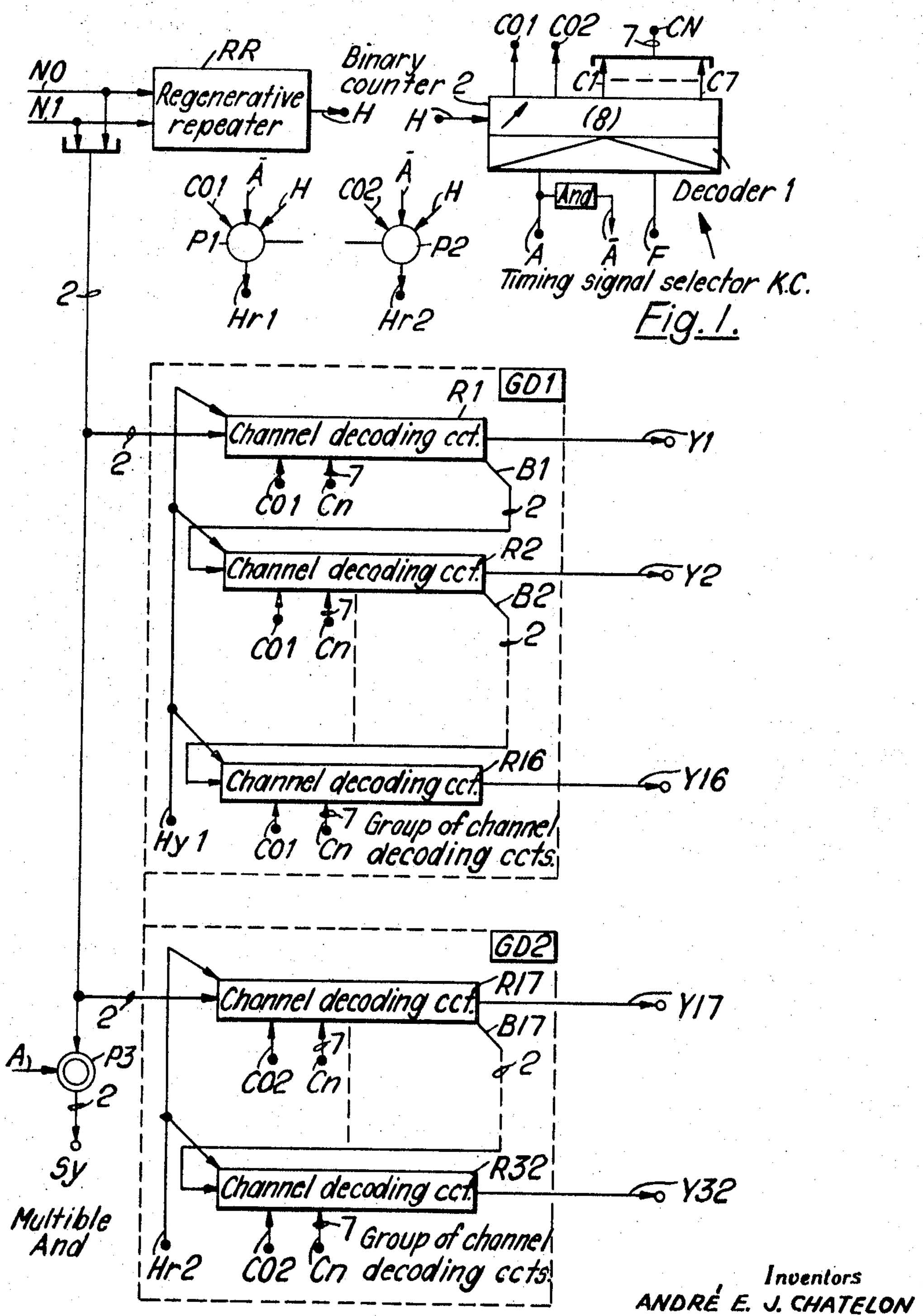
FIG. 1 is a general block diagram of the decoder in accordance with the principles of this invention.
Figures 3, 4:
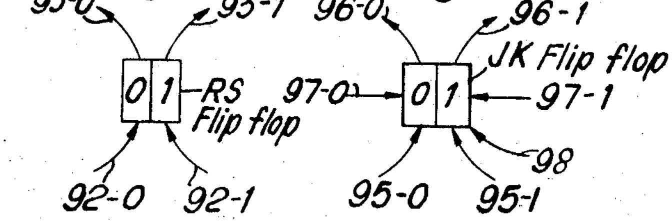
Figures 5, 6, 7:
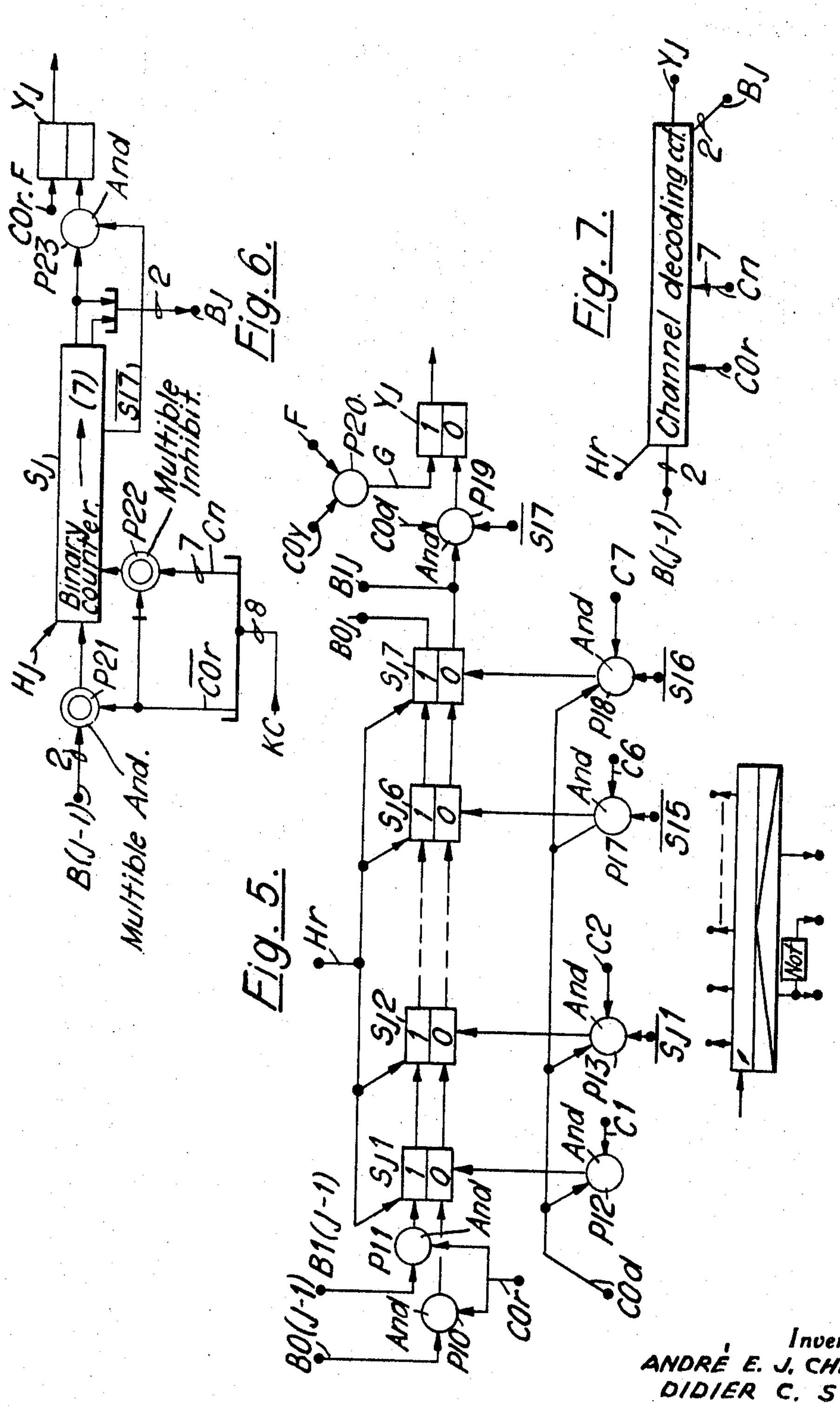

FIGS. **2.*a* to 2*g* are timing diagrams of signals related to the operation of the decoder of FIG. 1**;

FIG. 3 is a symbol for a flip-flop of the RS-type;

FIG. 4 is a symbol for a flip-flop of the JK-type;

FIG. 5 is a detailed block diagram of a channel decoding circuit of FIG. 1;

FIG. 6 is a simplified block diagram of the circuit of FIG. 5;

FIG. 7 is a symbolic representation of the circuit of FIG. 5; and

Figure 8:
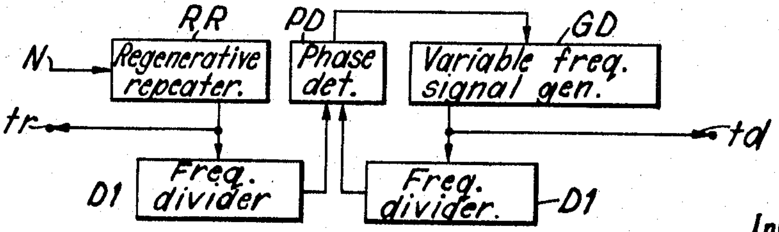

FIG. 8 is a block diagram of a synchronization circuit to synchronize input signals used for decoding with the input code signals.

DESCRIPTION OF THE PREFERRED EMBODIMENT

The decoder according to the invention is designed for being used in a PCM time division multiplex transmission system have parameters defined as follows;

-sampling frequency *Fs*

-duration of one operation cycle (reception cycle *Tcr* or decoding cycle *Tcd*)

$$Tcd)\ Tcr=Tcd=Tc\ \frac{1}{2Fs})$$

-number of digits received per operation cycle; *p*

-number of channels used for the transmission of messages; *m*

-number of digits per message; *n*

-number of digits used per cycle of operation for the transmission of signalling and/or synchronization informations; *y*.

It results therefrom that $$p=\frac{m\times n}{2}+y$$

and that, when *tr* equals the duration of one digit time slot, $$Tcr=\frac{m\times n+2y}{2}tr. \qquad (1)$$

On the other hand, during the decoding cycle, there is generated in the master counter a series of codes which are compared to the codes stored in the channel counters and, if td equals the period of the advance signals applied to the master counter generating these codes:

$Tcd=2^n \cdot td$ (2)

Equation (2) is for the case where there is no compression. Where there is compression, *td* is not constant but *Tcd* keeps the same value.

By combining equations (1) and (2)

$$\frac{2^{n+1}}{m\times n+2y}=\frac{tr}{td} \qquad (3)$$

Equation (3) expresses the relation between the different parameters of the system.

It will be noted that, in order to assure the equality of the cycles T*cd* and T*cr*, provision has to be made for a synchronization circuit of the signals *td* and *tr* except in the case where $$\frac{tr}{td}=1$$

More precisely, the signals *td* must be synchronized with the signals *tr*, the duration of which is fixed by the transmission. FIG. 8 represents, by way of example, a phase lock circuit which assures this synchronization in the case where the ratio *tr*/*rd* is not an integer number. It comprises regenerative repeater RR to which are applied the code signals N obtained by detection of the signals received, frequency divider D1, D2, phase detector PD and variable frequency signal generator GD delivering signals of period *td*.

The division ratios of circuits D1 and D2 are so chosen that the frequencies of the signals they deliver and which are applied to phase detector PD are nominally equal. The error signal delivered by detector PD is applied to generator GD for controlling the frequency of the signals *td* in such a direction that the error is canceled.

The synchronization circuit just described delivers signals of constant period *td* used in a linear decoder.

The decoder according to the present invention may also present a nonlinear characteristic identical to the multilinear characteristics of the decoders described in the copending applications of A.E.J. CHATELON, Ser. No. 577,896, filed Sept. 8, 1966 and J.P. LE CORRE et al. Ser. No. 581,605, filed Sept. 23, 1966. To this effect, it is sufficient to realize the phase-lock loop in such a way that generator GD delivers signals of period *t'd* which define the quantizing unit step. The signals having a period which are a multiple of the period *t'd*, to define the higher values of quantizing steps, may be obtained, for instance, by means of dividing circuits set into operation at the time of slope modification in the multilinear characteristic.

Thus, in the coder described in the copending application, Ser. No. 577,896, the total number of quantizing units steps is $2^{11}=2048=2^a$.

Equation (2) then becomes $Tcd=2^a \cdot t'd$ (2') and equation (3) then becomes $$\frac{2^{a+1}}{m\times n+2y}=\frac{tr}{t'd} \qquad (3')$$

The advance of the decoding or master counter which comprises $n$ flip-flops plus one flip-flop delivering the operation cycle signals is controlled by signals $td$ and the $2^{n+1}$ different codes it generates in time succession defines the duration of the sampling cycle $$\frac{1}{Fs}=2Tc$$

By way of a nonlimiting example, a linear decoder in which $m=32={}^{5}$, $n=7,y16$, will be chosen for description hereinbelow.

With these particular values, from equation (3), $tr=td=t$. Therefore, it is not necessary to provide for a synchronization circuit such as shown on FIG. 8.

The number of digits received during an operation cycle $Tc$ is $2^n$=128, which are distributed into:

$$\frac{m}{2}\times n=112$$

message digits; $y$=16 signalling and/or synchronization digits occupying a time $ty$.

These signalling and/or synchronization digits may be distributed in various ways, for instance, by adding a digit to each message, or by grouping them at the end of the transmission of one group of m/2 messages.

FIG. 1 is the general block diagram of the decoder according to the present invention, in which the code digits, received on the complementary inputs N0, N1, are written alternately in the channel group circuits GD1, GD2, each of these circuits being connected to the input during a duration $Tc—ty$ in such a way that the signalling and/or synchronization digits should not be decoded. This connection is controlled by signals $Hr1$ and $Hr2$ which will be defined hereafter. Since the reception times of the signalling digits are known in advance, decoder 1 coupled to the master decoding counter 2 produces an appropriately timed signal A to extracted by these signalling digits multiple AND P3. These signalling digits appear, in direct and complemented form, on the outputs $Sy$.

In each group circuit, there are $m/2$ channel decoding circuits referenced R1 to R16 for the group GD1 and R17 to R32 for the group GD2.

During an operation cycle which will be called "odd cycle," circuits R1 to R16 are connected in series to constitute a shift register wherein register R1 receives the input signals N0, N1, so that the $mn/2$ digits received during this cycle are introduced in time succession into said shift register (reception cycle). During this time, the $m/2$ codes stored in the registers R17 to R32, which are no longer connected in series, are decoded by comparing them to the $2^n$ codes supplied by the $n$ less significant flip-flops of the decoding counter 2 (decoding cycle). An odd operation cycle corresponds to a decoding cycle for the group GD2 and to a reception cycle for the group GD1.

Figures 2A, 2B, 2C, 2D, 2E, 2F, 2G:
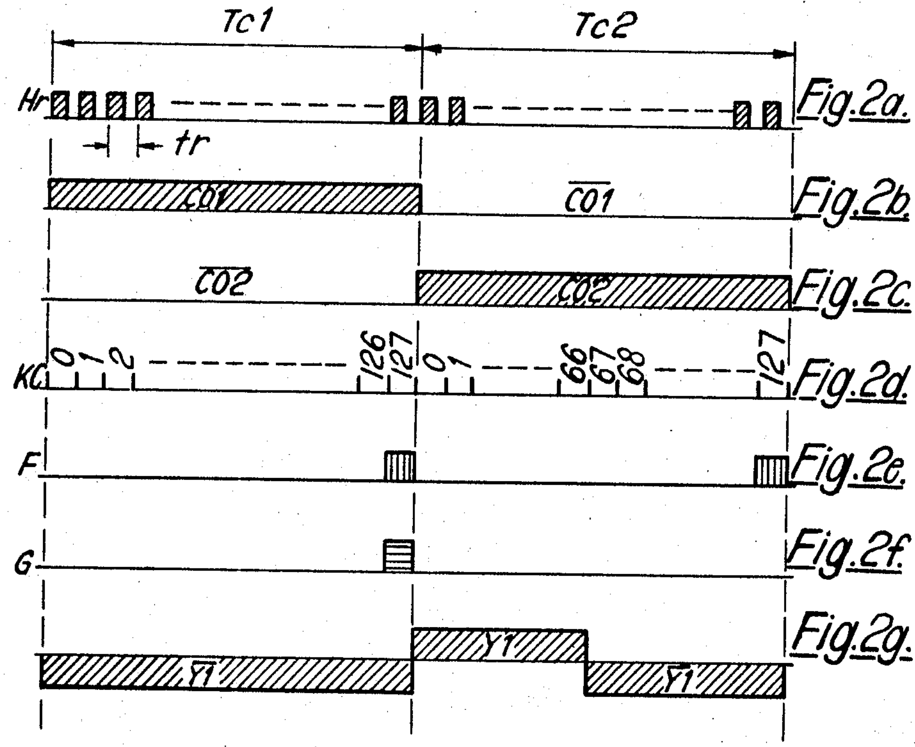

These operations are controlled by signals delivered by the following circuits;

-Regenerative repeater RR which receives in series form the code signals N1 and their complement N0 which are delivered by a pulse detection circuit of well known design and which is not shown on the FIG. Circuit RR delivers clock signals H of period $Tr$ and of duty factor 0.5 which are shown on FIG. 2$a$; and -Selector KC which comprises master decoding counter 2 having $(n+1)$ =8 flip-flops C0, C1...C7. The 1 and 0 of the flip-flop C0 $Tc$to the terminals C01, C02 and the 1 outputs of the other flip-flops are connected to the terminals C1 at C7. This set of seven signals is referenced $Tcn$.

The diagrams of FIGS. 2$b$ and 2$c$ show the signals appearing on the outputs C01, C02 of selector KC during two successive operation cycles $Tc1$ (odd cycle) and $Tc2$ (even cycle). As it has been seen previously, each cycle is divided into $2^n$=128 digit time slots so that flip-flop C0 changes its state at each cycle, and that the signals C01 and CO2 appear alternately with a period of two operation cycles (it will be noted that CO1=C02 and CO2=C01).

FIG. 2$d$ shows the numbers stored in the flip-flops C1 to C7 in the form codes. Decoder 1 of selector KC delivers, first, the above mentioned signal A and, second, signals F to indicate the end of a cycle which appear, as it may be seen in FIG. 2$e$, each time flip-flops C1 to C7 show the code 127.

AND gates P1 and P2 deliver the signals which control the storage of the received signals, these write control signals being referenced $Hr1$ and Hr2.

The table hereafter groups the different signals used for controlling the reception of the codes and their decoding in the circuits GD1 and GD2.

TABLE

| | General signals | Particular signals | |
|---|---|---|---|
| | | Group GD1 | Group GD2 |
| Reception time Tr | COr | CO1 | CO2 |
| Decoding time Tc | COd | $\overline{CO1}$ | $\overline{CO2}$ |
| Write control signals | $Hr=COr\cdot\overline{A}\cdot H$ | $Hr1=CO1\cdot\overline{A}\cdot H$ | $Hr2=CO2\cdot\overline{A}\cdot H$ |
| | 1 | 2 | 3 |

Column 1 of the TABLE groups the general signals which will be used during the detailed description of the operation of a channel decoding circuit in relation with FIGS. 5,6 and 7. In the two other columns there is shown the particular signals applied to the group of circuits GD1 and GD2 in FIG. 1.

Before describing a channel decoding circuit, the operation of the various types of flip-flops which are used in the said circuit will be described.

FIG. 3 represents a bistable circuit or "flip-flop" of the "RS" type. The setting of this circuit into the 1 or the 0 state is controlled by the application of a signal on the input 92–1 or 92–0. A voltage of same polarity as that of the control signals appear either on the output 93–1 when the flip-flop is in the 1 state or on the output 93–0 when it is in the 0 state with a time delay which depends upon the elements of the circuits. If the flip-flop is referenced RS, the logical condition which characterizes the fact that it is in the 1 or 0 state will be written RS or RS. It should be noted that, if control signals are simultaneously applied on the inputs 92–0 and 92–1 the final state of the flip-flop is indeterminate.

FIG. 4 represents a flip-flop of the "JK" type in which the change of state resulting from the application of control signals over the inputs 95–1 or 95–0 are controlled by the clock signals applied on the input 98. The switching occurs, for instance, on the trailing edge of the clock signal so that the delay between the control and the appearance of the final state signals on the outputs 96–0 and 96–1 is determined by the duration of the clock signal. Besides, a flip-flop of this type may be forced to the 1 or 0 state, regardless of the amplitude of the clock signal, by applying a control signal on the input 97–1 or 97–0.

It should be noted that, if control signals are simultaneously applied on the inputs 95–1 and 95–0, a JK flip-flop switches at the next clock time.

FIG. 5 is the detailed block diagram of a channel decoding circuit comprising a binary counter including JK flip-flops $Sj1$ to $Sj7$, RS flip-flop Y$j$ and AND gates P10 to P20, as well as selector KC wherein the outputs of the flip-flop CO have been designated by C0$r$ and C0$d$, these references being defined in column 1 of the above TABLE. It should be remembered that C0$d$=C0

As it has been seen previously, this circuit operates either as a shift register when a signal C0$r$ is present or as a decoding circuit when a signal C0$d$ is present.

1. Operation as a shift register (reception cycle). Flip-flops S$j$1 to S$j$7 are directly connected in series and they receive, during the reception cycle, an advance signal H$r$ (see TABLE). They constitute therefore a shift register. The input signals are applied to two wires at the inputs $B1_{(j-1)}$ (direct signal) and $B0_{(j-1)}$ (complementary signal), and the output signals are obtained on the outputs B0$j$ and B1$j$. During a reception cycle, signal C0$r$ activates AND's P10 and P11 and signal H$r$ controls the advance of the signals received on the inputs except when signal A is present. If this register belongs to circuit R1 (R17) its inputs are connected to terminals N0, N1 and its outputs to the inputs of the register of circuit R2 (R18) etc...If it belongs to the circuit R16 (R32) its outputs are not connected. It will be noted that AND's P12 to P19 are blocked and that, at the end of the cycle, AND P20 is activated for the condition G = Cor.F, the signal G controlling the setting of flip-flop Y$j$ to the 1 state (see FIGS. 2$f$ and 2$g$).

2. Operation as a code comparator (decoding cycle). The occurence of signal C0$d$ blocks the advance of the registers (condition H$r$) and inhibits the operation of AND's P10 and P11 (condition C0$r$). On the other hand, signal CO$d$ activates AND's P12 to P19. During this cycle, counter 2 of selector KC shows the succession of codes 0 to 127 (see FIG. 2$d$) and signals C1 to C7 are applied to a second input of AND's P12 to P18, respectively. Last a third input of AND's P13 to P18 receives a signal characterizing the state of some of the flip-flops S$j$1 to S$j$6. Thus, associated with flip-flop S$j$2 is activated when a signal S$j$1 is present, i.e., if flip-flop S$j$1 is in the 0 state;

P14 (not shown on the FIG.) which is associated with flip-flop S$j$3 is activated by the signal S12, where S12=S$j$1.S$j$2; etc....; and P18 is activated by the signal S16=S$j$1.S$j$2...S$j$6. Thus, signal S14, for instance, means that flip-flops S$j$1 to S$j$4 are in the 0 state.

The decoding is carried out as follows, by assuming that the code stored in flip-flops S$j$1 to S$j$7 is 1000011, or 67 in decimal code. At the beginning of the cycle, counter 1 of selector KC shows the binary code 0000001 (decimal 1) for which it delivers a signal C7. Only AND P18 receives this signals, but it remains blocked since flip-flops S$j$1 and S$j$6 are in the 1 state. Further on flip-flops C2 to C7 of counter 1 switch to the code 0111111 (63 in decimal code), but none of AND's P12 to P18 could have been activated since signal C1 is 0 and the flip-flop S$j$1 is in the 1 state.

When counter 1 shows the next code 1000000 (decimal 64), signal C1 is 1 and AND P12 is activated and controls the resetting of flip-flop S$j$1 to the 0 state. At the next time, flip-flop C7 of counter 1 sets to the 1 state but, since flip-flop S$j$6 is still in the 1 state, AND P18 remains blocked. Afterwards, flip-flop C6 of counter 21 sets to the 1 state. Therefore, since flip-flops S$j$1 to S$j$5 are in the 0 state, AND P17 is activated and flip-flop S$j$6 is reset to the 0 state. Last, at the next time, when the counter shows the same code as flip-flops S$j$1 to S$j$7, flip-flop C7 of counter 1 sets to the 1 state and AND P18 controls the resetting of flip-flop S$j$7 to the 0 state. All flp-flops S$j$1 to S$j$7 are then in the 0 state and AND P19 is activated by S17=S$j$1.S$j$2...S$j$7 controlling the resetting of flip-flop Y$j$ to the 0 state (see FIG. 2$g$). It is thus seen that the duration of the signal which appears on the 1 output of flip-flop Y$d$ is proportional to the value of the coded number to be decoded.

FIG. 6 is a simplified block diagram of the various circuits of FIG. 5 in which the multiple AND gates P21 show symbolically AND gates P10, P11 and the multiple INHIBIT gates P22 show symbolically AND gates P12 to P18, the signal C0$d$ having been replaced by signal C0$r$.

Last FIG. 7 is the symbolic representation of a channel decoding circuit such as shown on FIG. 1.

While we have described above the principles of our invention in connection with specific apparatus, it is to be clearly understood that this description is made only by way of example and not as a limitation of the scope of our invention s set forth in the objects thereof and in the accompanying claims.

We claim:

1. A digital-to-analog converter comprising: INPUT MEANS for $m$ digital codes in serial form, each of said codes having $n$ digits, where both $m$ and $n$ are integers greater than one;

master binary counting means having a plurality of output signals coupled to said input means operating in synchronism with the timing of the digits of said codes;

a first group of $m/2$ binary counting means coupled to said input means and said master counting means responsive to selected ones of said output signals to connect each of said counting means of said first group as independent counting means for a first given time interval and to connect each of said counting means of said first group as a shift register and in series with each other for a second given time interval different than said first time interval, said counting means of said first group being loaded with $m/2$ of said codes during said second time interval;

a second group of $m/2$ binary counting means coupled to said input means and said master counting means coupled to said input means and said master counting means responsive to said selected ones of said output signals to connect each of said counting means of said second group as independent counting means for said second time interval and to connect each of said counting means of said second group as a shift register and in series with each other for said first time interval, said counting means of said second group being loaded with the remaining $m/2$ of said codes during said first time interval;

first $m/2$ logic circuit means, each of said first logic circuit means being coupled to a different one of said counting means of said first group and in common to said master counting means responding to said selected ones of said output signals, others of said output signals and the code stored in the associated one of said counting means of said first group during said first time interval to produce a pulse width modulated signal having a width representative of the code stored in said associated one of said counting means of said first group; and second $m/2$ logic circuit means, each of said second logic circuit means being coupled to a different one of said counting means of said second group and in common to said master counting means responding to said selected ones of said output signals, others of said output signals and the code stored in the associated one of said output counting means of said second group during said second time interval to produce a pulse width modulated signal having a width representative of the code stored in said associated one of said counting means of said second group.

2. A converter according to claim 1, wherein said master counting means includes:

a binary counter having ($n$+1) stages coupled in series with each other and said input means, the ($n$+1) *th* stage of said series coupled stages providing said selected ones of said output signals and the first $n$ stages of said series coupled stages providing certain ones of said others of said output signals; and a decoder coupled to predetermined ones of said ($n$+1) stages to produce the remainder of said others of said output signals.

3. A converter according to claim 1, wherein each of said counting means of said first and second groups include:

a binary counter having $n$ stages coupled in series with each other; and a coincidence type logic circuit coupled to said master counting means and the input of said binary counter responsive to the appropriate one of said selected ones of said output signals during the appropriate one of said first and second time intervals to connect said binary counters of each of said first and second groups in series with each other and said input means and to load each of said binary counters with an associated one of said codes.

4. A converter according to claim 3, wherein each of said stages of each of said binary counters include a JK flip-flop.

5. A converter according to claim 3, wherein
said input means includes
first means to provide said codes, and
second means to provide the complement of said codes;
each of said stages of each of said binary counters include a first input and a first output for said codes, and
a second input and a second output for said complement of said codes;
said first output being coupled to said first input and said second output being coupled to said second input of adjacent ones of said stages; and
said coincidence-type logic circuit includes;
a first AND gate coupled between said first means and said first input of the first stage of the first binary counter of each of said first and second groups responsive to said one of said selected ones of said output signals;
a second AND gate coupled between said second means and said second input of the first stage of the first binary counter of each of said first and second groups responsive to said one of said selected ones of said output signals;
a third AND gate coupled between said first output of the last stage and said first input of the first stage of each adjacent ones of said binary counters of each of said first and second groups responsive to said one of said selected ones of said output signals; and
a fourth AND gate coupled between said second output of the last stage and said second input of the first stage of each adjacent ones of said binary counters of each of said first and second groups responsive to said one of said selected ones of said output signals.

6. A converter according to claim 3, wherein
each of said first and second logic circuit means includes:
$n$ AND gates each being coupled to said master counting means and a different one of said $n$ stages of an associated one of said binary counters, each of said AND gates being responsive to the appropriate one of said selected ones of said output signals during the appropriate one of said first and second time intervals, a different one of certain ones of said others of said output signals and selected digits of the code stored in said associated one of said binary counters;
a first additional AND gate coupled to said master counting means and the last of said $n$ stages of said associated one of said binary counters responsive to an output signal of said last of said $n$ stages, said appropriate one of said selected ones of said output signals and selected digits of the code stored in said associated one of said binary counters;
a second additional AND gate coupled to said master counting means responsive to said appropriate one of said selected ones of said output signals and another one of said others of said output signals, and
a flip-flop coupled to said first and second additional AND gates to produce said pulse width modulated signal.

7. A converter according to claim 1, wherein
each of said first and second logic circuit means includes:
$n$ coincidence devices coupled to each of said counting means of each of said first and second groups, each of said devices being responsive to one of said selected ones of said output signals, a different one of certain ones of said others of said output signals and selected digits of the code stored in said associated one of said counting means;
a first additional coincidence device coupled to the output of each of said counting means of each of said first and second groups responsive to an output of said counting means and at least selected digits of the code stored in said associated one of said counting means;
a second additional coincidence device coupled to said master counting means responsive to the other of said selected ones of said output signals and another one of said others of said output signals; and
a bistable device coupled to said first and second additional coincidence devices to produce said pulse width modulated signal.

8. A converter according to claim 7, wherein
each of said coincidence devices include an AND gate.

9. A converter according to claim 7, wherein
each of said $n$ coincidence devices include an INHIBIT gate.

10. A converter according to claim 1, wherein
said master counting means includes:
a first binary counter having $(n+1)$ stages coupled in series with each other and said input, the $(n+1)$ *th* stage of said series coupled stages providing said selected ones of said output signals and the first $n$ stages of said series coupled stages providing certain ones of said others of said output signals; and
a decoder coupled to predetermined ones of said $(n+1)$ stages to produce the remainder of said others of said output signals;
each of said counting means of said first and second groups include
a second binary counter having $n$ stages coupled in series with each other, and
a coincidence-type logic circuit coupled to said first binary counter and the input of said second binary counter responsive to the appropriate one of said selected of said output signals during the appropriate one of said first and second time intervals to connect said second binary counters of each of said first and second groups in series with each other and said input means and to load each of said second binary counters with an associated one of said codes; and
each of said first and second logic circuit means includes
$n$ AND gates each being coupled to said first binary counter and a different one of said $n$ stages of an associated one of said second binary counters, each of said AND gates being responsive to the appropriate one of said selected ones of said output signals during the appropriate one of said first and second time intervals, a different one of said certain ones of said others of said output signals and selected digits of the code stored in said associated one of said secondary binary counters;
a first additional AND gate coupled to said first binary counter and the last of said $n$ stages of said associated one of said second binary counters responsive to an output signal of said last of said $n$ stages, said appropriate one of said selected ones of said output signals and selected digits of the code stored in said associated one of said second binary counters;
a second additional AND gate coupled to said first binary counter and said decoder responsive to said appropriate one of said selected ones of said output signals and one of said remainder of said other of said output signals; and
a flip-flop coupled to said first and second additional AND gates to produce said pulse width modulated signal.